United States Patent

Sato

Patent Number: 5,994,731
Date of Patent: Nov. 30, 1999

[54] SEMICONDUCTOR DEVICE AND FABRICATION METHOD THEREOF

[75] Inventor: Natsuki Sato, Tokyo, Japan

[73] Assignee: NEC Corporation, Tokyo, Japan

[21] Appl. No.: 08/895,593

[22] Filed: Jul. 16, 1997

[30] Foreign Application Priority Data

Jul. 19, 1996 [JP] Japan ............................... 8-190992

[51] Int. Cl.⁶ .......................... H01L 29/68; H01L 29/78
[52] U.S. Cl. .................. 257/306; 257/297; 257/345; 257/400
[58] Field of Search ................................ 257/306, 345, 257/297, 398, 399, 400

[56] References Cited

U.S. PATENT DOCUMENTS

| | | | |
|---|---|---|---|
| 5,276,344 | 1/1994 | Arima et al. | 257/306 |
| 5,384,476 | 1/1995 | Nishizawa et al. | 257/345 |
| 5,412,237 | 5/1995 | Komori et al. | 257/306 |

FOREIGN PATENT DOCUMENTS

| | | | |
|---|---|---|---|
| 60-10769 | 1/1985 | Japan | 257/306 |
| 3-16153 | 1/1991 | Japan | 257/296 |
| 3-139861 | 6/1991 | Japan | 257/296 |
| 6-209091 | 7/1994 | Japan | 257/296 |
| 8-23035 | 1/1996 | Japan | 257/296 |

*Primary Examiner*—Donald L. Monin, Jr.
*Attorney, Agent, or Firm*—Sughrue, Mion, Zinn, Macpeak & Seas, PLLC

[57] ABSTRACT

A semiconductor device comprising a semiconductor substrate of a first conductivity type, an element separating field oxide film formed on the semiconductor substrate and a MOS transistor formed in an element area defined by the field oxide film. The MOS transistor includes a gate electrode and source and drain regions each comprising a diffusion layer of a second conductivity type opposite the conductivity type of the semiconductor substrate. The semiconductor device further comprises a channel stopper of the first conductivity type and a punch-through stopper of the first conductivity type provided below the field oxide film and gate electrode, respectively. Furthermore, a diffusion layer of the second conductivity type of the MOS transistor does not contact the channel stopper and the punch-through stopper. Also disclosed is a method of fabricating the semiconductor device.

20 Claims, 7 Drawing Sheets boron ion

SEMICONDUCTOR DEVICE AND FABRICATION METHOD THEREOF

BACKGROUND OF THE INVENTION

1. Field of the Invention

The present invention relates to a semiconductor device and a fabrication method thereof and, more particularly, to a semiconductor device having a reduced leakage current. The semiconductor device includes a MOS transistor having a channel stopper below a field oxide film and a punch-through stopper in a region below and in the vicinity of the gate electrode of the MOS transistor.

2. Description of the Related Art

With the miniaturization of integrated circuit devices formed in a semiconductor substrate, there has been a need to miniaturize the constituent elements of the integrated circuit device and to increase the integration density thereof. In order to accommodate such requirements, the distance between elements, that is, the width of the field oxide film which is an element separating region, must also be minimized. Practically, a field oxide film having a width of 0.5 μm or narrower is required. However, when the width of the element separating region is minimized, the element separating performance thereof is degraded. A punch-through phenomenon then occurs between adjacent elements which results in current leakage. In order to solve this problem, a method has been proposed in which a guard ring is provided in a portion of the semiconductor substrate which is immediately below the field oxide film. The guard ring is provided by forming an impurity region of the same conductivity type as that of the semiconductor substrate but having a partially increased impurity concentration. Another method is known in which an impurity region of the same conductivity type as that of the semiconductor substrate is formed not only in the portion of the semiconductor substrate which is immediately below the field oxide film but also in portions of the semiconductor substrate which are below the diffusion layer and the gate electrode. That is, the subject impurity region may be formed in the whole surface of the semiconductor substrate.

An example of a conventional MOS transistor utilizing this technique is shown in FIG. 4. This figure shows an example of a dynamic RAM cell constructed with a MOS transistor and a MOS capacitor, in which an element region is defined by forming a field oxide film 2 on a p type semiconductor substrate 1, a gate oxide film 4 and a gate electrode 5 are formed in the element region, and n type diffusion layers 6S and 6D are formed as respective source and drain, regions. A contact hole is formed in an inter-layer insulating film 8, and a storage electrode 9 is then formed which is connected to the drain region 6D through an $n^+$ type diffusion layer 7. The MOS capacitor is formed by providing a capacitance insulating film 10 and then a plate electrode 11 on an upper surface of the storage electrode. Furthermore, a channel stopper 3A is formed immediately below the field oxide film 2 of the p type semiconductor substrate 1, and a punch-through stopper 3B contiguous to the channel stopper is formed immediately below the MOS transistor.

FIGS. 5(a) and 5(b) show cross sections of the dynamic RAM cell of FIG. 4, including the main fabrication steps thereof. First, as shown in FIG. 5(a), a field oxide film 2 which becomes the element separating region of the p type semiconductor substrate 1 is formed to a thickness of 400 nm by the LOCOS method, etc. In this technique, only the element separating region is exposed to thermal oxidation using a mask of an anti-oxidation material such as a silicon nitride film. The $p^+$ type channel stopper 3A for preventing the punch-through phenomenon, that is, the structure for preventing current leakage between adjoining elements, is formed immediately below the element separating region. The $p^+$ type channel stopper 3A may be formed by masking a region prior to forming the field oxide film 2 by thermal oxidation, and implanting boron ion into only those portions in which the field oxide film is to be formed. However, in order to reduce the number of fabrication steps, a method is used in which the channel stopper 3 is formed by implanting boron into the whole surface of the semiconductor substrate after the field oxide film 2 is formed. That is, boron is implanted by adjusting the implanting energy thereof such that, in the element separating region, boron penetrates the field oxide film 2 to form a region having a peak boron concentration value immediately below the field oxide film 2. In the element region, the implant extends slightly deeper into the semiconductor substrate as measured from the surface of the semiconductor substrate, and in the prior art example, the boron concentration has a peak value located about 400 nm below the substrate surface. According to this method, the high concentration $p^+$ region functions as a channel stopper 3A in the region below the element separating region, and the high concentration $p^+$ region functions as a punch-through stopper 3B of the transistor in the region below the gate of the transistor. That is, both of these effects can be obtained in a single operation.

Then, as shown in FIG. 5(b), after the gate oxide film 4 is formed in the element region defined by the field oxide film 2 to a thickness of 10–15 nm, an $n^+$ type polysilicon film is deposited to a thickness of 200 nm and the gate electrode 5 (wordline) is patterned by etching the $n^+$ type polysilicon film by a known photolithography technique. Then, the n type diffusion layers 6S and 6D are formed by implanting phosphorous ion at a dose of $3\times10^{13}$ cm$^{-2}$ using the gate electrode 5 and the field oxide film 2 as a mask. The junction depth of the n type diffusion layers 6S and 6D is about 0.3 μm. These n type diffusion layers become the source and drain regions of the MOS transistor, respectively. Then, as the inter-layer insulating film 8, a silicon oxide film, for example, is deposited to a thickness of 500 nm. Thereafter, a contact hole 13 is formed using a photolithographic technique (not shown) to expose the n type diffusion layer 6D. Then, in order to reduce the contact resistance, phosphorous ion is again implanted (at a dose of about $1\times10^{14}$ cm$^{-2}$) into the contact portion, an n type polysilicon film is deposited on the whole surface of the substrate and, then, the polysilicon film is patterned to form the storage electrode 9 of the capacitor in the contact portion. Thereafter, the substrate is heat treated to thermally diffuse the impurity from the storage electrode 9 formed of the n type polysilicon through the contact hole into the n type diffusion layer 6D of the semiconductor substrate, and to thermally diffuse the impurity implanted into the contract portion of the storage electrode 9 into the n type diffusion layer 6D of the semiconductor substrate. This forms the extended $n^+$ type diffusion layer 7. Alternatively, the storage electrode 9 may be made into an n type storage electrode by depositing a non-doped polysilicon film, patterning it and diffusing an impurity such as phosphorous therein. In such case, it is possible to form the $n^+$ diffusion layer 7 simultaneously with the diffusion of phosphorous.

Thereafter, as shown in FIG. 4, capacitance insulating silicon oxide film 10 having a film thickness of 3–5 nm is formed on the upper and side surfaces of the storage electrode 9, and plate electrode 11 is formed from a 200 nm thick n type polysilicon film. The capacitance portion of the dynamic RAM cell is thus obtained. The final depth of the n$^+$ diffusion layer 7 is about 0.4–0.5 μm. The dynamic RAM cell is completed by forming a wiring (not shown) which becomes a bitline. That is, charge stored in the storage electrode 9 is transferred from the n$^+$ type diffusion layer 7 to the n type diffusion layer 6S by ON/OFF operation of the gate electrode 5 of the MOS transistor, so that data can be input/output.

In the construction shown in FIG. 4, however, the n$^+$ type diffusion layer 7 must be opened in the vicinity of the field oxide film 2 in order to miniaturize the element. Therefore, the n$^+$ type diffusion layer 7 contacts the p$^+$ type channel stopper 3A and the punch-through stopper 3B, resulting in a p$^+$-n$^+$ junction 15. FIG. 6 shows a profile of the impurity concentration of the p$^+$-n$^+$ junction 15, particularly, a profile thereof with respect to the punch-through stopper 3B. The profile of the p$^+$ type punch-through stopper 3B has an impurity concentration peak at a depth of about 0.4 μm and a concentration of about $5 \times 10^{17}$ cm$^{-3}$. On the other hand, the profile of the n$^+$ type diffusion layer 7 has an impurity concentration peak at the surface of the substrate and a concentration of about $5 \times 10^{18}$ cm$^{-3}$. Therefore, the p$^+$-n$^+$ junction 15 occurs at a depth of about 0.3 μm. However, the p$^+$-n$^+$ junction occurs at a depth where the p$^+$ and n$^+$ impurity concentrations of the p$^+$-n$^+$ junction are not peaks.

As a result, when a potential is applied thereto, a depletion layer extends substantially on both the p$^+$ and n$^+$ sides. Particularly, when the depletion layer extends to the n$^+$ side, there is a problem in that a G-R center (generation and recombination center which is related to the impurity concentration) in the n$^+$ type diffusion layer 7 may enter the depletion layer such that the stored charge leaks to the substrate side through the G-R center as a leakage path. Furthermore, in order to prevent this phenomenon, the amount of impurity diffusion from the storage electrode 9 may be increased to a value that is sufficient to compensate for the density of the p$^+$ type punch-through stopper 3B. However, there is a problem in that the n$^+$ type diffusion layer 7 may expand substantially not only in the depth direction but also in the lateral direction. As a result, the interval against an adjacent n$^+$ type diffusion layer may decrease, the breakdown voltage between n$^+$-n$^+$ areas may be reduced and charge may leak.

Alternatively, in order to reduce the leakage current, the impurity concentration of the p$^+$ type punch-through stopper 3B and the p$^+$ type channel stopper 3A may be reduced to restrict the expansion of the depletion layer to the n$^+$ type diffusion layer 7. However, the resulting performance of the stopper is insufficient and causes an increase in the leakage current. When a sufficient impurity concentration is set, the leakage at the p$^+$-n$^+$ junction increases resulting in an increase in the leakage current, as described above. As a result, in the case of a dynamic RAM, the stored charge leaks, the charge holding characteristics thereof are substantially degraded and the reliability thereof is decreased.

Patent Application Laid-open No. S60-10769 gazette proposes a structure having a punch-through stopper 3B and a channel stopper 3A independently formed below a gate electrode 5 and a field oxide film 2, respectively, as shown in FIG. 7. In this structure there is no p$^+$ type channel stopper below an n$^+$ type diffusion layer 6D of a contact portion. Thus, it is possible to reduce the junction leakage from the bottom surface of the n$^+$ type diffusion layer 6D. However, the side surface of the n$^+$ type diffusion layer 6D is in contact with the channel stopper 3A below the field oxide film 2 as well as the p$^+$ type punch-through stopper 3B below and in the vicinity of the gate electrode 5. Therefore, a p$^+$-n$^+$ junction ultimately exists in a lateral surface portion of the n$^+$ type diffusion layer 6D. Leakage from that junction is dominant and causes the same problem as described in the above prior art example.

SUMMARY OF THE INVENTION

It is therefore an object of the present invention to provide a semiconductor device having a contact portion in which leakage from a diffusion layer connected to the source and drain of a MOS transistor is substantially reduced, and a method of fabricating the semiconductor device.

The above object has been achieved in a first aspect of the present invention by providing a semiconductor device comprising a semiconductor substrate of a first conductivity type, an element separating field oxide film formed on the semiconductor substrate and a MOS transistor formed in an element area defined by the field oxide film, wherein a channel stopper of the first conductivity type and a punch through stopper of the first conductivity type are formed below the field oxide film and a gate electrode of the MOS transistor, respectively, and a diffusion layer of a second conductivity type of the MOS transistor separates but does not contact the channel stopper and the punch-through stopper.

The above object has also been achieved in a second aspect of the present invention by providing a method of fabricating a semiconductor device, comprising the steps of:

(a) providing a semiconductor substrate of a first conductivity type;

(b) forming an element separating field oxide film on a main surface of the semiconductor substrate;

(c) forming noncontiguous impurity regions of said first conductivity type to thereby provide a channel stopper below said field oxide film and a punch-through stopper below a gate electrode of a MOS transistor that is formed in a subsequent step; and (d) forming a MOS transistor in an element area of said semiconductor substrate defined by said field oxide film, including a gate electrode and source and drain diffusion layers of a second conductivity type opposite the conductivity type of said semiconductor substrate on opposing sides of said gate electrode, wherein one of said diffusion layers of a second conductivity type separates but does not contact said channel stopper and said punch-through stopper.

In a preferred embodiment, the inventive method further comprises the steps of:

(e) forming an inter-layer insulating film covering said gate electrode and said diffusion layers of the second conductivity type on a main surface of said semiconductor substrate;

(f) opening a contact hole in said inter-layer insulating film which extends to one of said source and drain diffusion layers;

(g) forming a contact electrode in said contact hole; and (h) forming a second diffusion layer containing a high concentration impurity of the second conductivity type under said contact hole.

DETAILED DESCRIPTION OF THE INVENTION

Figure 1:
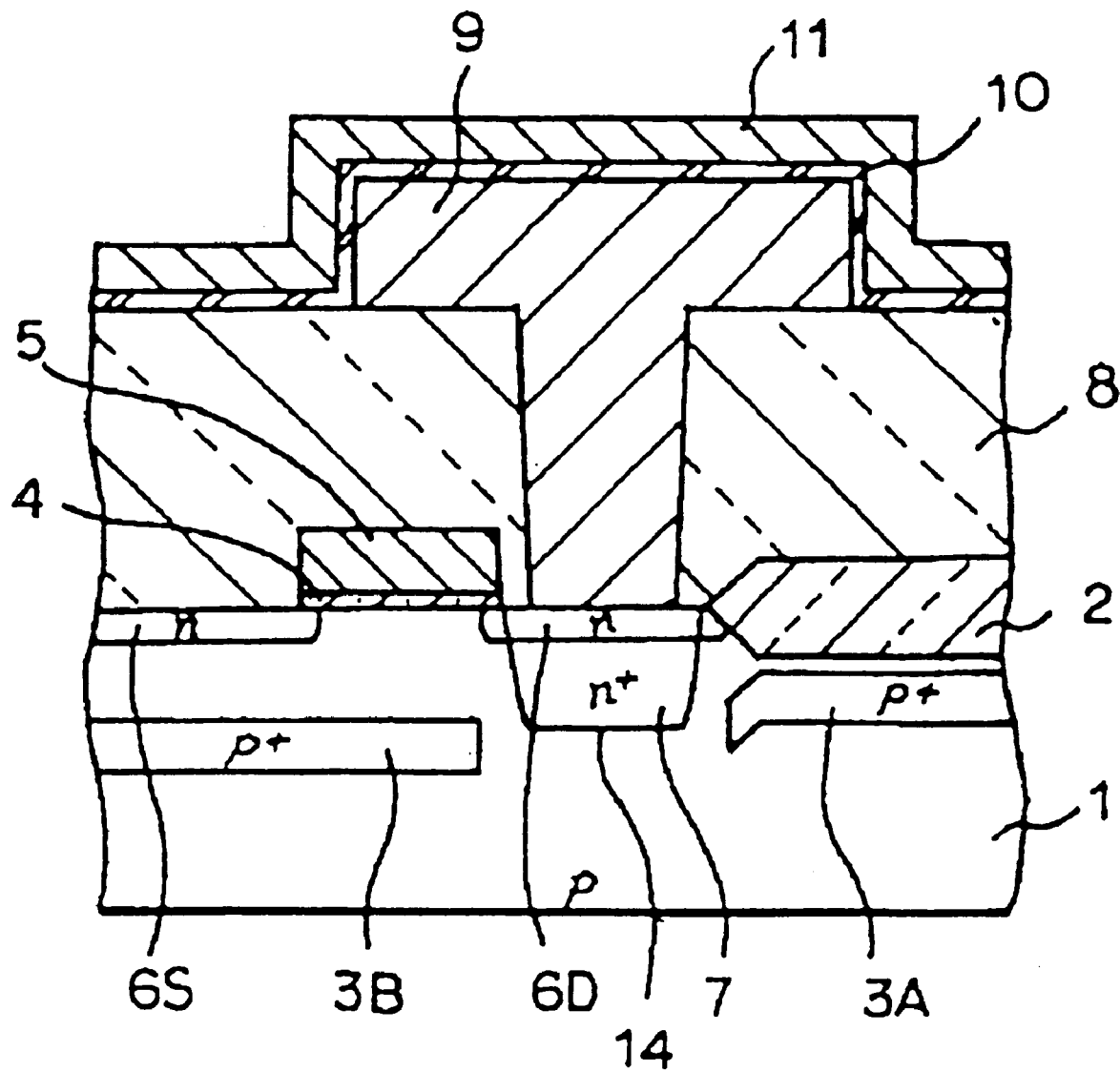
FIG. 1 is a cross section of an embodiment of a MOS transistor according to the present invention.

An embodiment of the present invention is described below by reference to the drawings as follows. FIG. 1 is a cross section of an embodiment of the present invention, in which a dynamic RAM cell is constructed with a MOS capacitor and a MOS transistor. In this figure, an element forming region is defined by a field oxide film 2 formed in a p type semiconductor substrate 1 and a p+ type channel stopper 3A is formed immediately below the field oxide film 2. Furthermore, a gate oxide film 4 and a gate electrode 5 are formed in the element region. On both sides of the gate electrode 5, n type diffusion layers 6S and 6D are formed as source and drain regions, respectively, and an n+ type diffusion layer 7 is formed in the drain region 6D. A storage electrode 9 provided in a contact hole of an inter-layer insulating film 8 is connected to the n+ type diffusion layer 7, and a capacitance insulating film 10 and a plate electrode 11 are formed on the storage electrode 9. Furthermore, a punch-through stopper 3B of the transistor is formed in a slightly deep portion of the substrate, in this case, about 400 nm below the gate electrode 5 and the n type diffusion layer 6S. Additionally, the channel stopper 3A and the punch-through stopper 3B are separated from each other and from the n type diffusion layer 6D and the n+ type diffusion layer 7, respectively.

Current leakage occurs in a diffusion layer due to an expansion of a depletion layer in a pn junction when the diffusion layer for a source/drain region of a MOS transistor contacts an element separating channel stopper and a punch-through stopper. A channel stopper 3A and a punch-through stopper 3B are formed by masking a diffusion layer region. The diffusion layer 6D of a MOS transistor does not contact either the channel stopper 3A or the punch-through stopper 3B, and current leakage in the diffusion layer due to expansion of the depletion layer in a pn junction is restricted. Particularly, it is possible to restrict current leakage in the diffusion layer 7, and to improve the charge holding characteristics of the capacitor. This is achieved by preventing the high concentration diffusion layer 7, which contacts the storage electrode 9 of a MOS capacitor, from contacting stoppers 3A and 3B when the high concentration diffusion layer is formed.

Figure 2A:
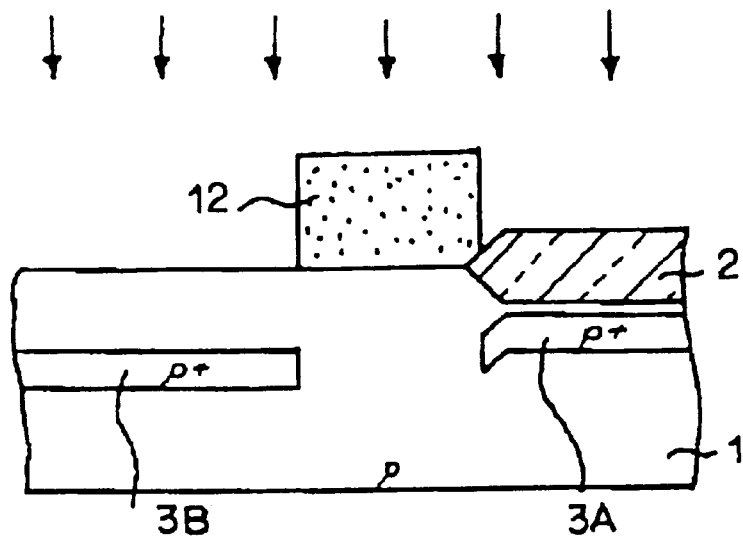
FIGS. 2(a)–2(c) are cross sections showing fabrication steps of the MOS transistor shown in FIG. 1.
Figure 2B:
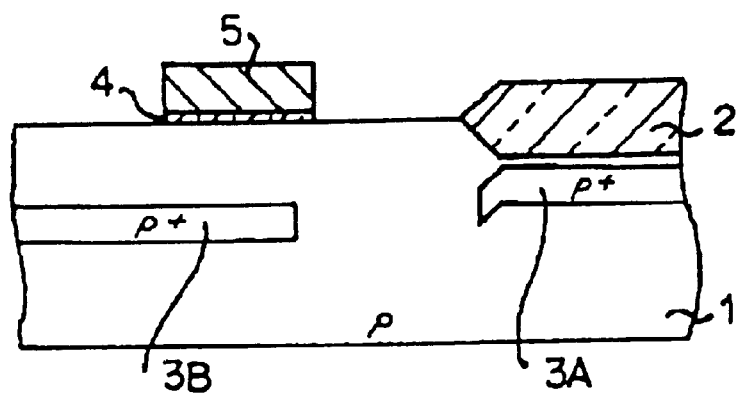
Figure 2C:
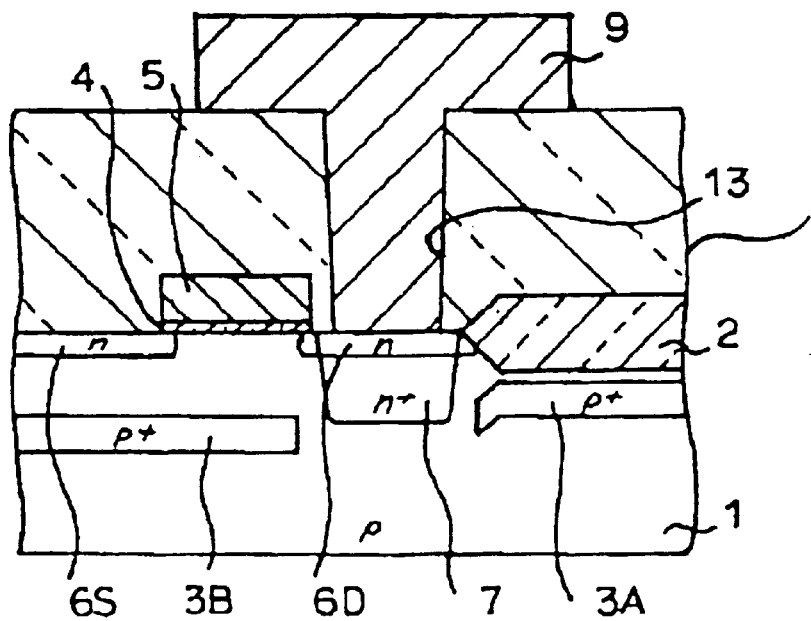

A method of fabricating a dynamic RAM having the structure shown in FIG. 1 is described as follows. FIGS. 2(a)–2(c) show cross sections and the main fabrication steps of the inventive technique. First, as shown in FIG. 2(a), field oxide film 2 is formed on the semiconductor substrate 1 to a thickness of 400 nm by the LOCOS method. Thereafter, a photoresist mask 12 is formed only on a desired region, that is, a region in which an n+ diffusion layer 7 is formed in a subsequent step. An object of the invention is to prevent current leakage from the n+ diffusion layer. Boron ion is implanted at an energy of 150 keV and a dose of 3E13 cm$^{-2}$ through the photoresist mask 12. In this manner, p+ type channel stopper 3A and punch-through stopper 3B are formed immediately below the field oxide film 2 and about 400 nm below the surface of the element separating region which is not covered by the photoresist 12, respectively, in a single step.

Then, after the photoresist 12 is removed, gate oxide film 4 is formed at a thickness of 10–15 nm in the element region defined by the field oxide film 2. Then, an n+ type polysilicon 200 nm thick film is deposited in the substrate, and the gate electrode 5 (wordline) is patterned by etching the n+ type polysilicon film using a known photolithographic technique, as shown in FIG. 2(b). Furthermore, the n type diffusion layers 6S and 6D are formed by implanting phosphorous ion at a dose of 3×10$^{13}$ cm$^{-2}$ using the gate electrode 5 and the field oxide film 2 as a mask. The junction depth of the n type diffusion layers 6S and 6D each is about 0.3 μm. These n type diffusion layers become the respective source and drain regions of the MOS transistor.

Then, as shown in FIG. 2(c), after a silicon oxide film, for example, is deposited to a thickness of 500 nm as inter-layer insulating film 8, contact hole 13 is opened to expose the n type diffusion layer 6D using a photoresist mask (not shown). Then, in order to reduce the contact resistance, phosphorous ion is again implanted (at a dose on the order of 1×10$^{14}$ cm$^{-2}$) in the contact portion. Thereafter, an n type polysilicon film is deposited on the whole surface of the wafer substrate, and the polysilicon film is patterned to form capacitor storage electrode 9 in the contact portion. Then, the substrate is heat treated to thermally diffuse the impurity from the storage electrode 9 formed of the n type polysilicon through the contact hole 13 into the n type diffusion layer 6D of the semiconductor substrate, and to thermally diffuse the impurity implanted into the contact portion of storage electrode 9 into the n type diffusion layer 6D of the semiconductor substrate. This forms the extended n+ type diffusion layer 7. Alternatively, the storage electrode 9 may be made into an n type storage electrode by depositing a non-doped polysilicon film, patterning it and diffusing therein an impurity such as phosphorous, etc. In such case, it is possible to form the n+ diffusion layer 7 simultaneously with the diffusion of phosphorous.

Thereafter, as shown in FIG. 1, capacitance insulating silicon oxide film 10 having a film thickness of 3–5 nm is formed on the upper and side surfaces of the storage electrode 9, and plate electrode 11 is formed from a 200 nm thick n type polysilicon film. The capacitance portion of the dynamic RAM cell is thus obtained. The final depth of the n+ diffusion layer 7 is about 0.4–0.5 μm. The dynamic RAM cell is completed by forming a wiring (not shown) which becomes a bitline.

Figure 3:
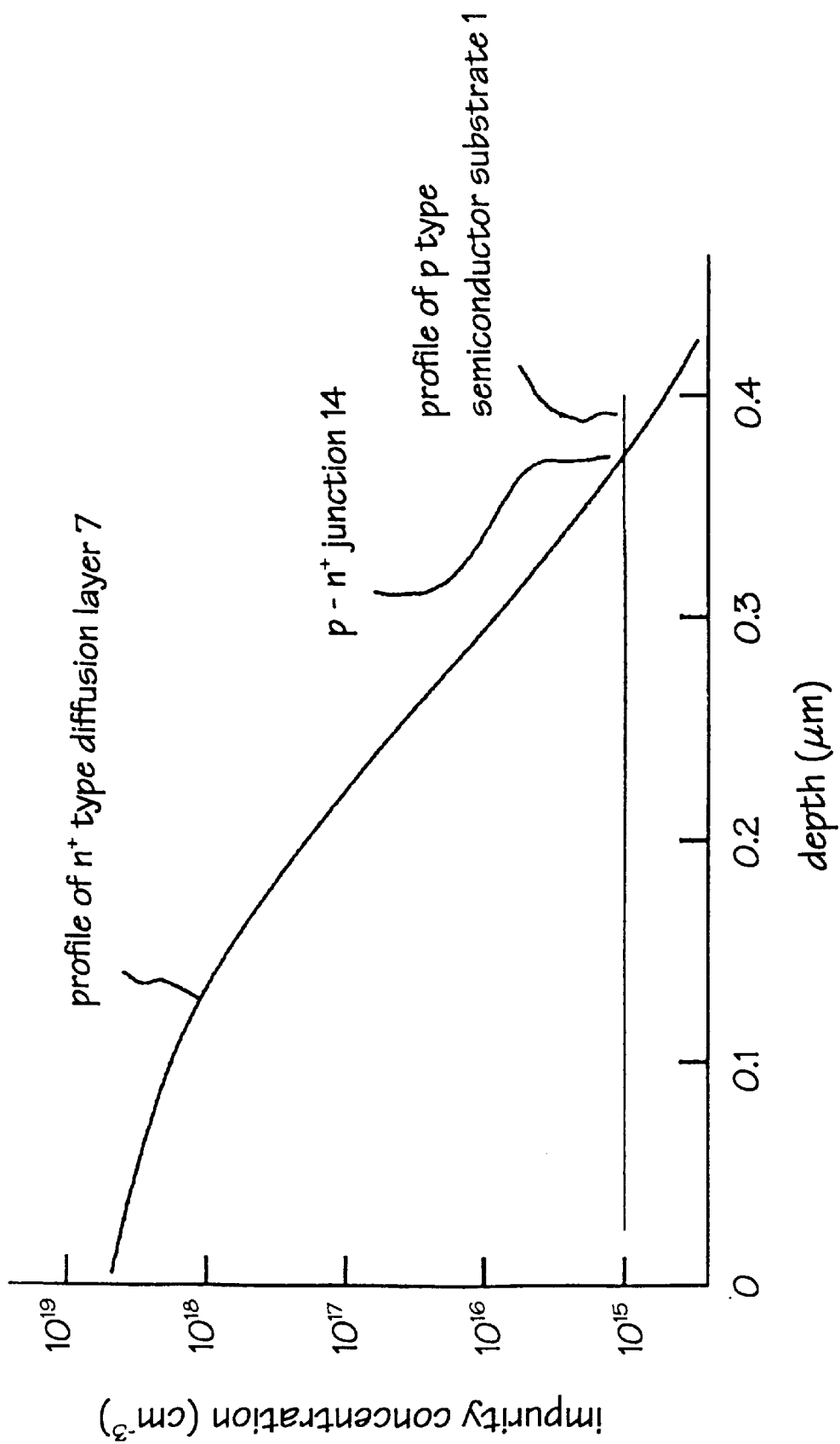
FIG. 3 is a figure showing an impurity density profile in the n+ type diffusion layer shown in FIG. 1.
Figure 4:
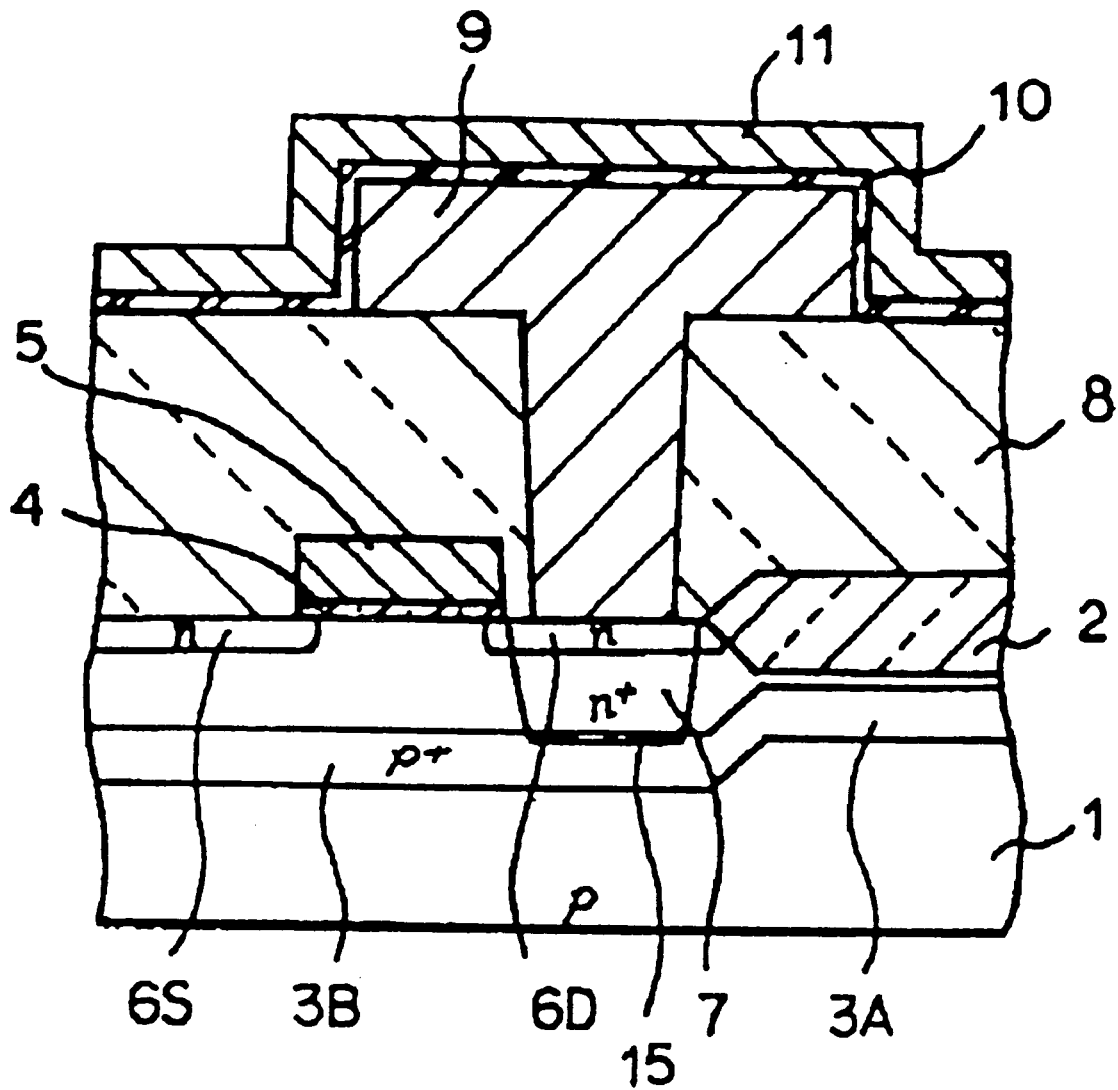
FIG. 4 is a cross section of a prior art MOS transistor.
Figure 5A:
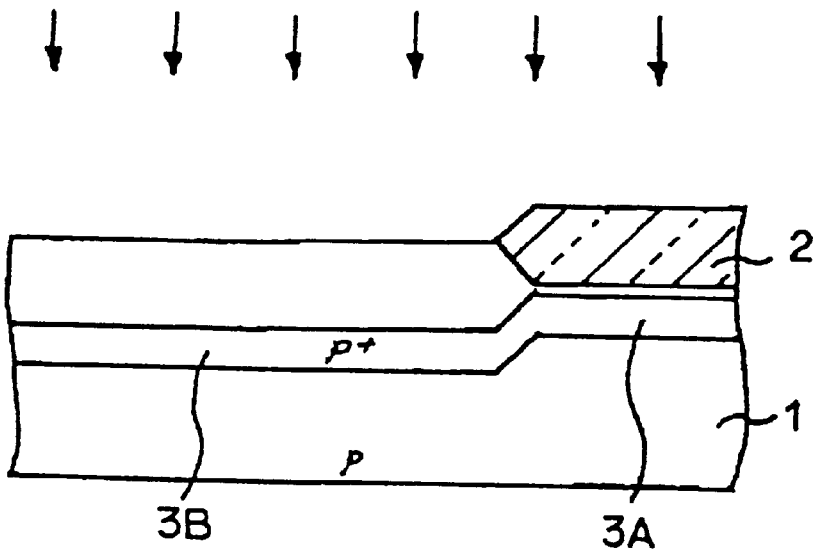
FIGS. 5(a) and 5(b) are cross sections showing the fabrication steps of the transistor of FIG. 4.
Figure 5B:
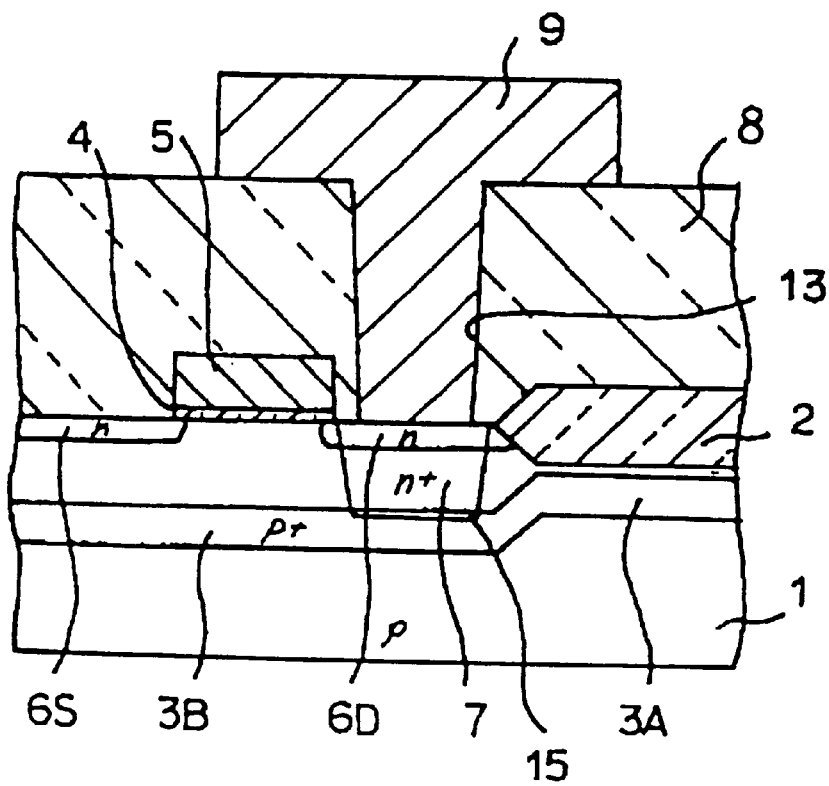
Figure 6:
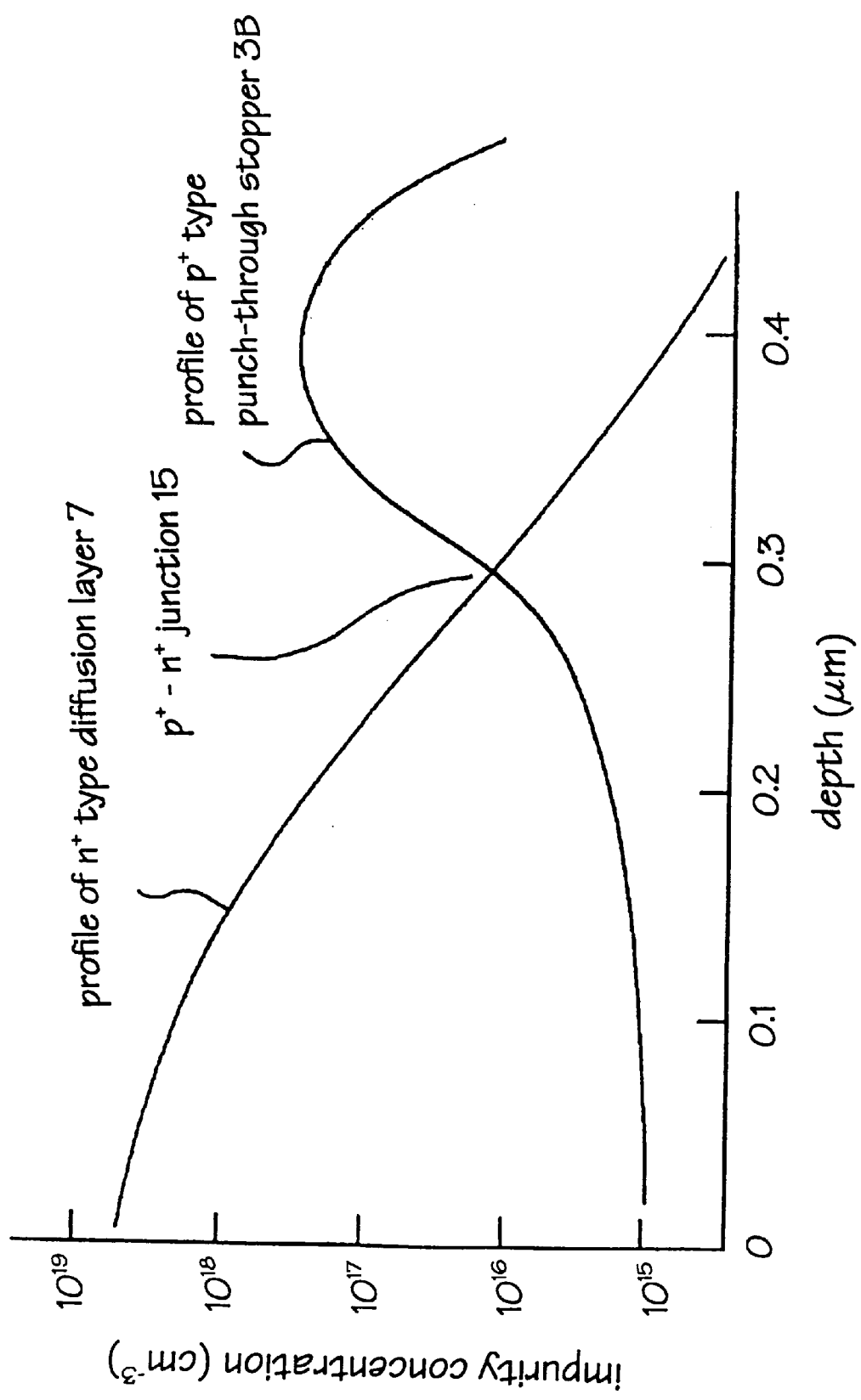
FIG. 6 is a figure showing an impurity density profile in the n+ type diffusion layer shown in FIG. 4.
Figure 7:
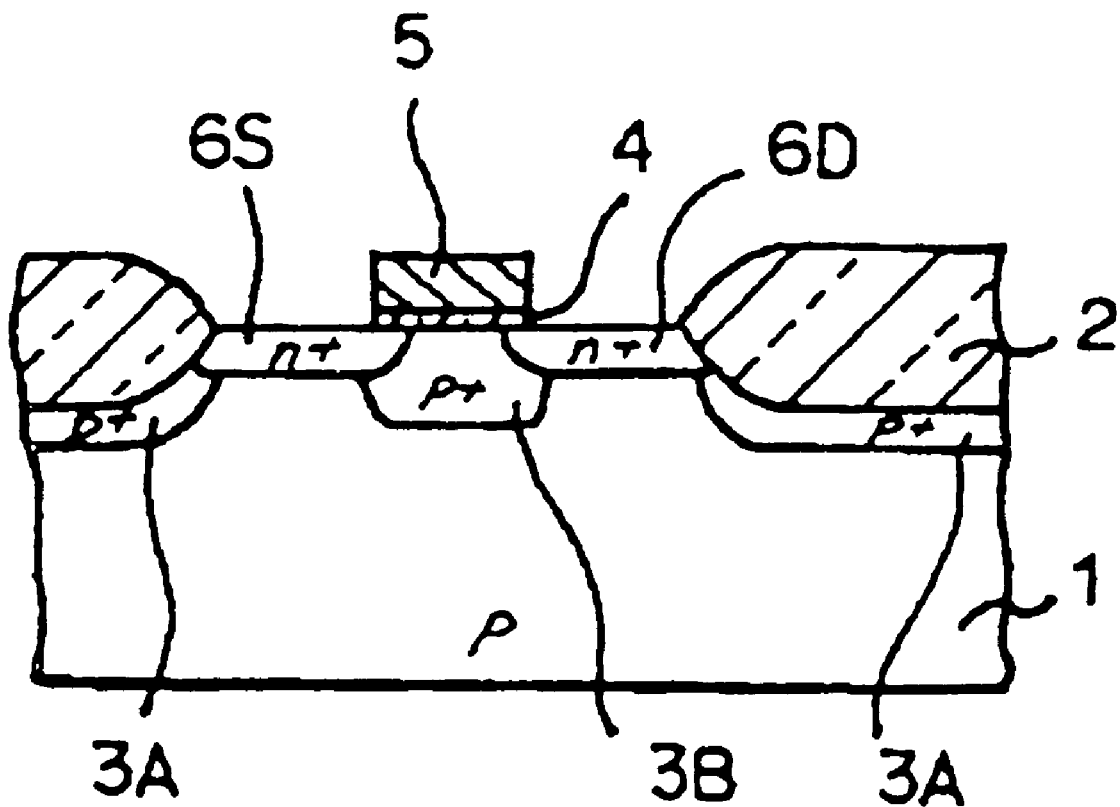
FIG. 7 is a cross section showing another prior art MOS transistor.

FIG. 3 shows a profile of the impurity concentration of the n+ type diffusion layer 7 and the p type semiconductor substrate 1 in the depth direction. The profile of the n+ type diffusion layer 7 has a concentration peak at the surface of the substrate and an impurity concentration of about 5×10$^{18}$ cm$^{-3}$. Generally, the n+ impurity concentration is from about 10$^{18}$–10$^{20}$ cm$^{-3}$. Also, because the n+ type diffusion layer 7 does not contact either the punch-through stopper 3A or the channel stopper 3B, the p-n+ junction occurs at a depth of about 0.4 μm and the p type side has the same impurity concentration as that of the substrate. Generally, the substrate has an impurity concentration of about 10$^{14}$–10$^{16}$ cm$^{-3}$. As a result, the difference in impurity concentration between p and n+ in the p-n+ junction 14 (see FIG. 1) is 1000 times or more and, when a potential is applied thereto, a depletion layer extends into the p side of the junction while it does not substantially extend into the n+ side. Therefore, current leakage does not occur through the G-R center in the n+ type diffusion layer 7, and good contact with the storage electrode 9 is obtained with a low leakage current. This is especially the case in a dynamic RAM, where the n+ type diffusion layer 7 is connected to the storage electrode 9 of the memory cell through the contact hole 13. Consequently, superior charge holding characteristics are obtained and a highly reliable dynamic RAM can be realized. Also, in this construction, the leakage current through the diffusion layer is reduced to about one third that found in a conventional device. Thus, the charge holding characteristics of the capacitor are improved about three fold.

Although the present invention has been described as applied to the contact portion on the capacitor side of a dynamic RAM, it is possible to simultaneously apply the present invention to the contact portion on the bitline side thereof. In that case, it is possible to even further improve the charge holding characteristics. As described above, in the present invention, the source and drain diffusion layers of the MOS transistor do not contact either the punch-through stopper or the channel stopper. As a result, the depletion layer in the pn junction does not extend to the diffusion layer side, there is no leakage current through the G-R center, and it is possible to construct a diffusion layer having reduced leakage. Therefore, it is possible to restrict current leakage from the contact electrode even when a high concentration diffusion layer for the contact electrode is formed. Particularly, when the present invention is applied to a dynamic RAM, the charge holding characteristics of the capacitor are improved three fold or more, and it is possible to provide a highly reliable semiconductor device. Furthermore, it is possible to restrict leakage current from the diffusion layer 7 even when the impurity concentration of the channel stopper and the punch-through stopper is increased. This is because the diffusion layer 7 does not contact the channel stopper 3A and the punch-through stopper 3B. Namely, the minute leakage current from the diffusion layer 7 and the characteristics of the punch-through and channel stoppers 3A, 3B are independently controlled. Thus, this structure improves the charge storage characteristics. An additional advantage is that minute leakage current from the diffusion layer 7 is not increased by the channel stopper and punch-through stopper.

It should further be apparent to those skilled in the art that various changes in form and detail of the invention as shown and described above may be made. It is intended that such changes be included within the spirit and scope of the claims appended hereto.

What is claimed is:

1. A semiconductor device comprising:
   a semiconductor substrate of a first conductivity type;
   an element separating field oxide film formed on said semiconductor substrate; and
   a MOS transistor formed in an element area defined by said field oxide film,
   wherein a channel stopper of the first conductivity type and a punch-through stopper of the first conductivity type are formed below said field oxide film and a gate electrode of said MOS transistor, respectively, and
   wherein a diffusion layer of a second conductivity type of said MOS transistor is interposed between said channel stopper and said punch-through stopper but does not contact said channel stopper and said punch-through stopper.

2. The semiconductor device as claimed in claim 1, wherein said diffusion layer of the second conductivity type comprises:
   at least one of a drain region and a source region of said MOS transistor; and
   a second diffusion layer containing a high concentration impurity of the second conductivity type and being integrally formed in said at least one of said drain and source regions,
   wherein said second diffusion layer is interposed between said channel stopper and said punch-through stopper but does not contact said channel stopper and said punch-through stopper.

3. The semiconductor device as claimed in claim 2, wherein said second diffusion layer is a contact diffusion layer for connecting a storage electrode or an electrode for wiring a MOS capacitor to said diffusion layer of said MOS transistor.

4. The semiconductor device as claimed in claim 1, wherein said punch-through stopper is located deeper within said semiconductor substrate than said channel stopper.

5. The semiconductor device as claimed in claim 1, wherein at least a portion of said diffusion layer is located as deep in said semiconductor substrate as at least a portion of said channel stopper.

6. The semiconductor device as claimed in claim 5, wherein at least a portion of said diffusion layer is located as deep in said semiconductor substrate as at least a portion of said punch-through stopper.

7. The semiconductor device as claimed in claim 6, wherein said punch-through stopper is located deeper within said semiconductor substrate than said channel stopper.

8. The semiconductor device as claimed in claim 7, wherein said channel stopper and said punch-through stopper are not contiguous.

9. The semiconductor device as claimed in claim 1, wherein said channel stopper and said punch-through stopper have a high impurity concentration of said first conductivity type and said semiconductor substrate has a substantially lower impurity concentration of said first conductivity type.

10. The semiconductor device as claimed in claim 1, wherein said channel stopper and said punch-through stopper are not contiguous.

11. A semiconductor device comprising:
    a semiconductor substrate of a first conductivity type;
    an element separating field oxide film formed on said semiconductor substrate; and
    a MOS transistor formed in an element area defined by said field oxide film,
    said MOS transistor including:
      a gate electrode; and
      source and drain regions each having a second conductivity type opposite the conductivity type of said semiconductor substrate,
    said semiconductor device further comprising:
      a channel stopper of the first conductivity type and a punch-through stopper of the first conductivity type provided below said field oxide film and gate electrode, respectively, and
      a diffusion layer of the second conductivity type of said MOS transistor that does not contact said channel stopper and said punch-through stopper, and a bottom portion of said diffusion layer being deeper than an upper portion of at least one of said channel stopper and said punch-through stopper.

12. The semiconductor device as claimed in claim 11, wherein said diffusion layer of the second conductivity type separates but does not contact said channel stopper and said punch-though stopper.

13. The semiconductor device as claimed in claim 11, wherein said diffusion layer of the second conductivity type is integrally formed in one of said drain and source regions and separates but does not contact said channel stopper and said punch-through stopper, said diffusion layer having an impurity concentration that is higher than that of said drain and source regions.

14. The semiconductor device as claimed in claim 11, wherein said diffusion layer of the second conductivity type is integrally formed in one of said drain and source regions and separates but does not contact said channel stopper and said punch-through stopper, wherein said diffusion layer has an impurity concentration that is higher than that of said drain and source regions, and wherein the semiconductor device further comprises a capacitor including a storage electrode having a first end which is connected to said diffusion layer, a capacitance insulating film provided on a second end of said storage electrode and a plate electrode formed on the capacitance insulating film.

15. The semiconductor device as claimed in claim 11, wherein said punch-through stopper is located deeper within said semiconductor substrate than said channel stopper.

16. The semiconductor device as claimed in claim 11, wherein at least a portion of said diffusion layer is located as deep in said semiconductor substrate as at least a portion of said channel stopper.

17. The semiconductor device as claimed in claim 16, wherein at least a portion of said diffusion layer is located as deep in said semiconductor substrate as at least a portion of said punch-through stopper.

18. The semiconductor device as claimed in claim 17, wherein said punch-through stopper is located deeper within said semiconductor substrate than said channel stopper.

19. The semiconductor device as claimed in claim 11, wherein said channel stopper and said-punch-through stopper have a high impurity concentration of said first conductivity type and said semiconductor substrate has a substantially lower impurity concentration of said first conductivity type.

20. The semiconductor device as claimed in claim 11, wherein said channel stopper and said punch-through stopper are not contiguous.

* * * * *